US007558971B2

(12) United States Patent
Casebolt et al.

(10) Patent No.: US 7,558,971 B2
(45) Date of Patent: Jul. 7, 2009

(54) ADAPTABLE POWER SUPPLY

(75) Inventors: Matthew P. Casebolt, Fremont, CA (US); Jack E. Randall, Felton, CA (US)

(73) Assignee: Rackable Systems, Inc., Fremont, CA (US)

( * ) Notice: Subject to any disclaimer, the term of this patent is extended or adjusted under 35 U.S.C. 154(b) by 694 days.

(21) Appl. No.: 11/099,396

(22) Filed: Apr. 4, 2005

(65) Prior Publication Data

US 2005/0218869 A1 Oct. 6, 2005

Related U.S. Application Data

(60) Provisional application No. 60/560,159, filed on Apr. 6, 2004.

(51) Int. Cl.
*H05K 5/00* (2006.01)
*H02M 1/00* (2007.01)

(52) U.S. Cl. ....................... 713/300; 361/752; 361/753; 361/724; 361/823; 361/687; 361/683

(58) Field of Classification Search ................. 713/300; 361/683, 687, 724, 753, 823
See application file for complete search history.

(56) References Cited

U.S. PATENT DOCUMENTS 5,202,536 A 4/1993 Buonanno
5,347,430 A 9/1994 Curlee et al.
5,351,176 A 9/1994 Smith et al.
5,612,854 A * 3/1997 Wiscombe et al. .......... 361/727
5,684,271 A 11/1997 Scholder et al.
5,726,866 A 3/1998 Allen
5,821,636 A * 10/1998 Baker et al. .................. 307/70
6,129,598 A * 10/2000 Yu et al. ..................... 439/883
6,163,454 A 12/2000 Strickler
6,215,659 B1 4/2001 Chen
6,252,160 B1 6/2001 Chang et al.
6,349,042 B1 2/2002 Mills et al.
6,414,851 B2 7/2002 Cherniski et al.
6,477,061 B1 11/2002 Johnson
6,480,398 B1 11/2002 Fiora et al.
6,496,366 B1 12/2002 Coglitore et al.
6,512,673 B1 1/2003 Wiley
6,560,114 B2 5/2003 Berry et al.
6,621,000 B2 9/2003 Jensen et al.
6,862,173 B1 3/2005 Konshak et al.
7,042,720 B1 5/2006 Konshak et al.
2003/0124971 A1 7/2003 Williams
2003/0128516 A1 7/2003 Faneuf et al.
2005/0265004 A1 12/2005 Coglitore et al.

* cited by examiner

*Primary Examiner*—Abdelmoniem Elamin
(74) *Attorney, Agent, or Firm*—Cooley Godward Kronish LLP

(57) ABSTRACT

An adaptable power supply for a computer system is provided, including: a power supply case, a power adapter, an input power connector, and a plurality of output connectors fixably mounted to the power supply case, and clustered into at least two clusters for connection to computer system components or subsystems via individual power cables. A method of manufacturing a computer system is also described, including: providing an adaptable power supply having output connectors, and connecting a plurality of computer system components to the power supply output connectors using individual cables. A computer system containing an adaptable power supply is also described.

13 Claims, 5 Drawing Sheets

ADAPTABLE POWER SUPPLY

RELATED APPLICATIONS

This application claims the benefit of U.S. Provisional Application No. 60/560,159, filed Apr. 6, 2004, which is incorporated herein by reference in its entirety.

BACKGROUND OF THE INVENTION

A power supply for a computer system must provide power to many peripheral components of the computer system, such as modems, compact disk drives, hard disk drives, floppy drives, SCSI drives, processors, scanners, motherboards, and the like. The power demands on a computer system power supply must be balanced with the demands of computer design and performance. Space inside the housing of a computer system is often at a premium. Thus, a computer power supply should connect to computer system components and fit into the computer system housing, without interfering with thermal needs (e.g. cooling), the operation of other components, or access to the computer system components. These requirements are particularly problematic because the overall sizes, shapes and requirements of computer components vary, and can rapidly change as technology changes. Further, there is a growing need for more compact computer systems, as well as custom and alternatively configured computer systems. Many power supplies limit the design and size of computer systems in undesirable ways.

One type of power supply has an integrated cable system, in which power output cables project from the body of the power supply. An example of this is shown in FIGS. 1 and 2. The prior art power supply 13 shown in FIG. 1 has output cable connections 10, which exit the back of the power supply in a large bundle 15. This power supply has "hardwired" cables of fixed length and the output power supplied by each cable is preset. FIGS. 2A-C show this power supply attached to a computer system. The bundle of output cables takes up considerable space within the computer system housing. Cable extenders are used to reach peripheral components that are more remotely located from the power supply. These extenders are in inconvenient and also take up valuable computer housing space. Even when the peripheral components are located close to the power supply, excess cable length clutters the computer system housing. Further, the extensive cables of such power supplies can block cooling airflow across components of the computer system.

The large bundle of output cable connections project from one general location in prior art power supplies, as shown in FIGS. 1 and 2. This results in a bulky mass of connecting wires at this location. This design does not consider the layout of the computer system, such as the location of the components. It is desirable to make more efficient connections between the components and the power supply.

Assembly time is another important consideration in manufacturing computer systems. Manufacturing time is required to attach extension cables, to tie wraps and route excess cables. In addition, servicing computer systems using power supplies such as those shown in FIGS. 1 and 2 is more difficult because of the complexity of the routing pattern required to make the connections between the power supply and the computer system components. Furthermore, a technician may have problems fitting the wires back into the computer housing.

Computer system manufacturers using such power supplies must usually stock multiple models of computer power supplies. Power supplies like the one shown in FIG. 1 have only a fixed number of cable connectors of a given output power, connector design or voltage level. Thus, computer system designs requiring different power needs require stocking another model power supply, or incorporating multiple power supplies in the design. Stocking additional power supplies can increase costs by necessitating large inventories of different designs in order to quickly assemble different types of computer systems.

Another power supply design which can be used to avoid some of these problems is the so-called "hot-swap" power supply design. In "hot-swap" power supplies, edge connectors are used to provide "modular" power supplies which connector into a fixed back-plate (also called a base module or back-plane). Computer system components are hard-wired to the back plate, avoiding the use of bulky cable connections. Unfortunately, edge connector designs are more expensive than comparable power supplies which make cable connections. Furthermore, edge connector power supplies require more space in the computer system housing because the additional power back-plate. Finally, edge connector power supplies may also be limited in the amount of current that they can handle.

Accordingly, it may be desirable to provide a power supply which allows flexibility in the kinds of connections, the locations of connections, and the output power supplied.

BRIEF SUMMARY OF THE INVENTION

In accordance with embodiments of the present invention, a power supply is provided. The power supply described herein can have output connectors capable of connecting to individual computer subsystems via individual power cables. The power supply can include an outer case. The power supply can include at least one voltage sensing line. Output connectors can be independently located at different sites on the power supply case. The output connectors can be located at recesses within the power supply case. The output connectors can be oriented in any direction with respect to the plane of the power supply case. The output connectors can be of different types. The output connectors can be different configurations. The output connectors can correspond to different voltages and/or current requirements. The output connectors could incorporate a voltage sensing line. The power supply can have a connection for an input power cable that can connect to an external power source.

Other features and aspects of the invention will become apparent from the following detailed description, taken in conjunction with the accompanying drawings which illustrate, by way of example, the features in accordance with embodiments of the invention. The summary is not intended to limit the scope of the invention, which is defined solely by the claims attached hereto.

In the following description, reference is made to the accompanying drawings which form a part thereof, and which illustrate several embodiments of the present invention. It is understood that other embodiments may be utilized and structural and operational changes may be made without departing from the scope of the present invention. The use of the same reference symbols in different drawings indicates similar or identical items.

DETAILED DESCRIPTION OF THE INVENTION

Figure 1:
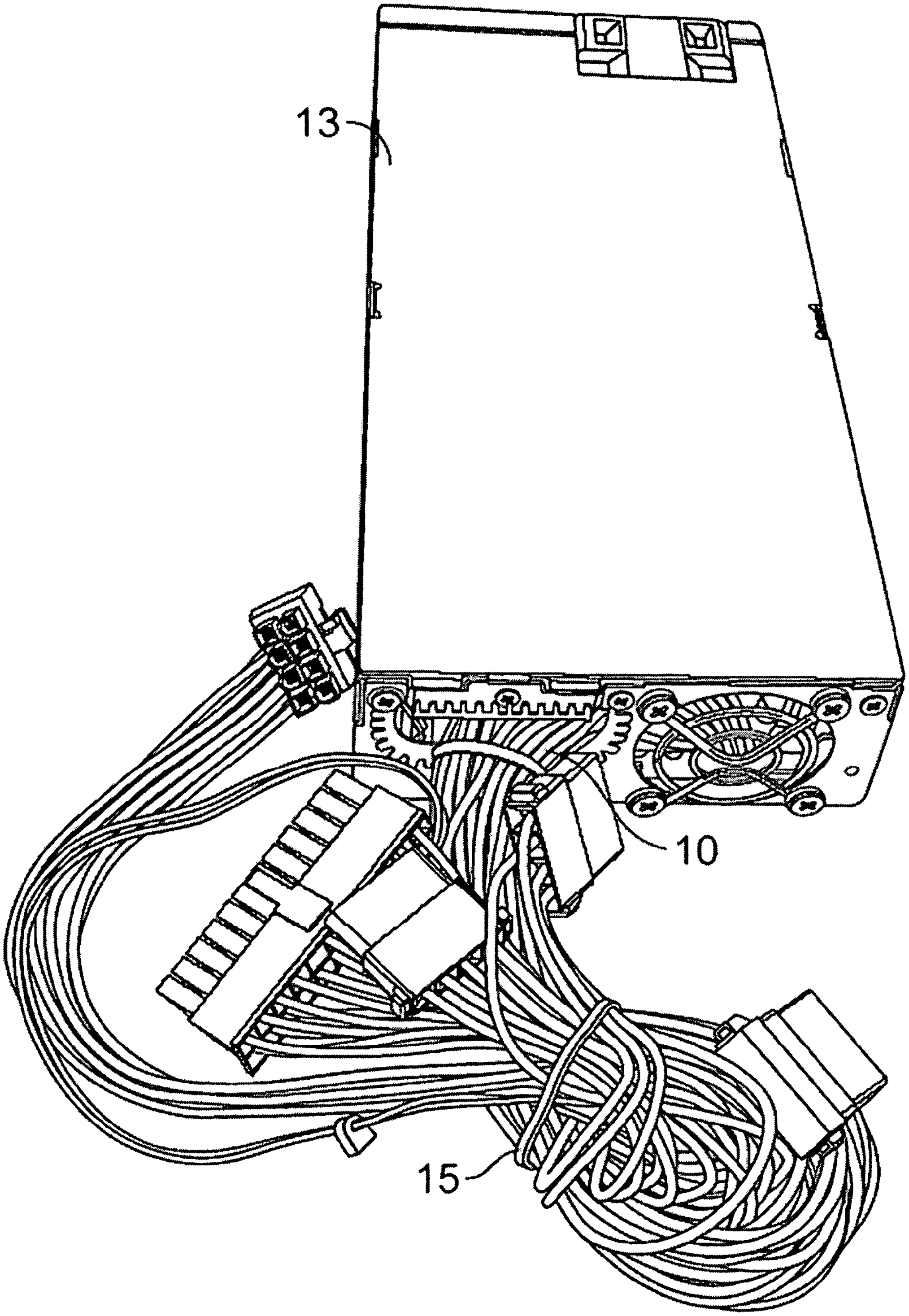
Fig. 1 PRIOR ART
FIG. 1 is a perspective view of a PRIOR ART power supply system, showing extruding cables.
Figure 2:
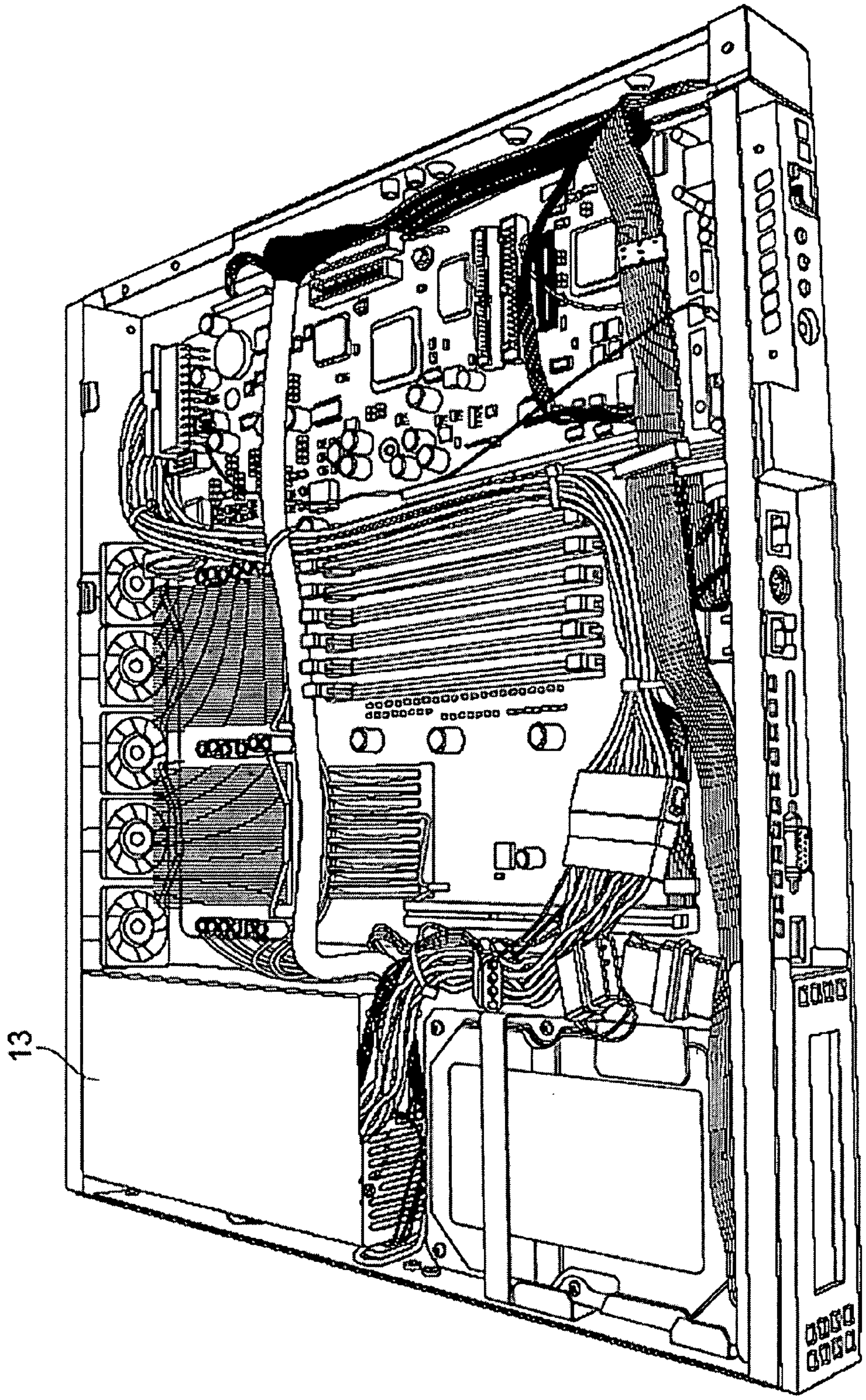
FIG. 2 (Prior Art)
FIG. 2 is a perspective view of a PRIOR ART power supply system attached to computer subsystems including a motherboard, and disk drive.
Figure 3:
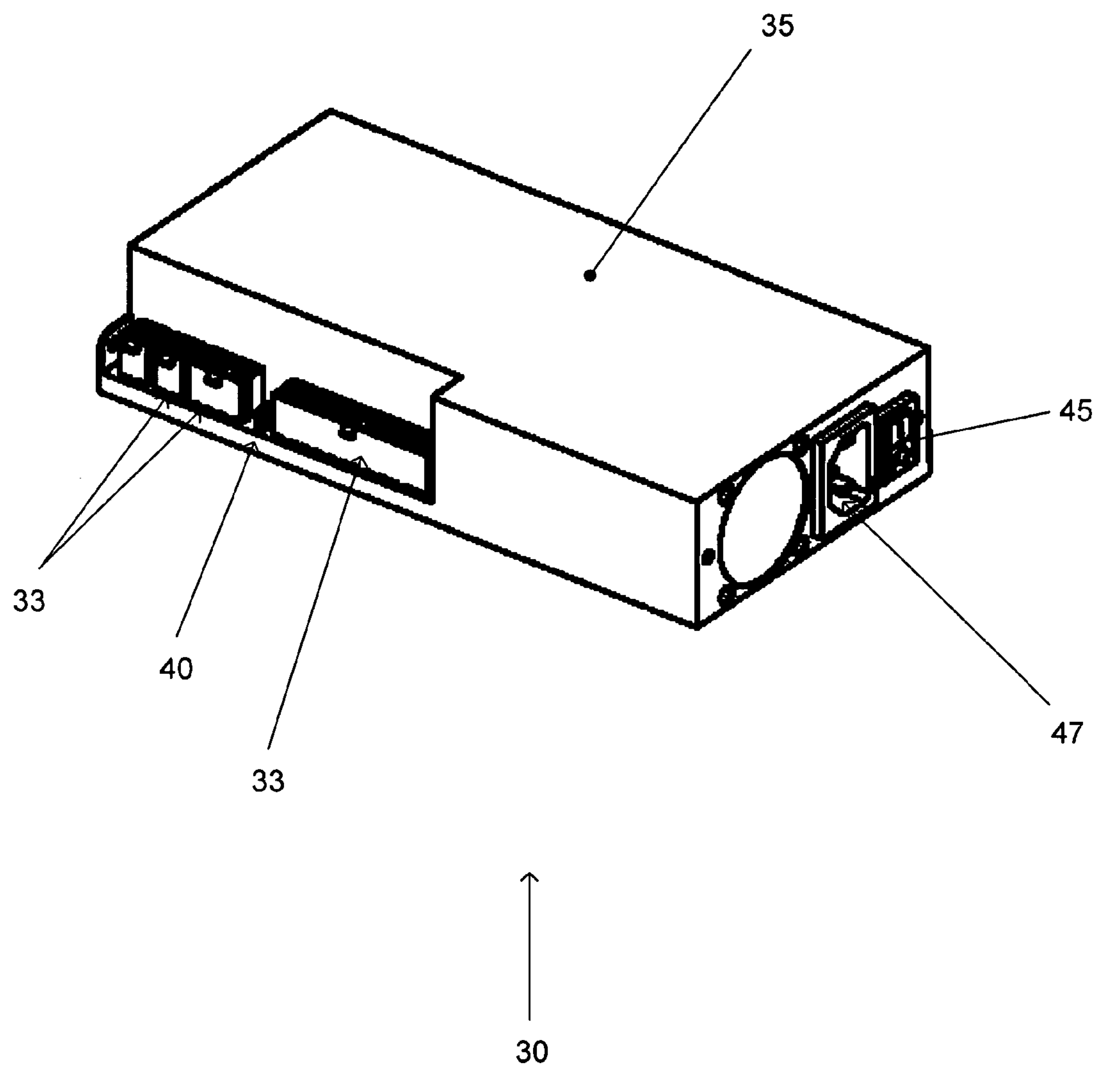
FIG. 3 shows a side elevation of a power supply system in accordance with embodiments of the present invention.

FIG. 3 shows a side elevation of a power supply 30 with output connectors which connect power cables directly to individual computer subsystems. The power supply system can be used to power a computer system. In one embodiment, the power supply system operates in the range of 200 to 600 watts. In one embodiment, the power supply system is a 350 watt power supply. The power supply can provide power to computer servers, personal computers, storage devices, and the like.

In one embodiment, the power supply includes a power adapter which converts input electrical power (as from a wall line) into power suitable for running all or some of the components of a computer system. Thus, the power supply can provide power to all or some of the components of computer system. In some embodiments, the power adapter receives AC power of a certain voltage level (e.g. 110 V) and converts that AC power into a DC current of one or more different voltages.

Figure 4A:
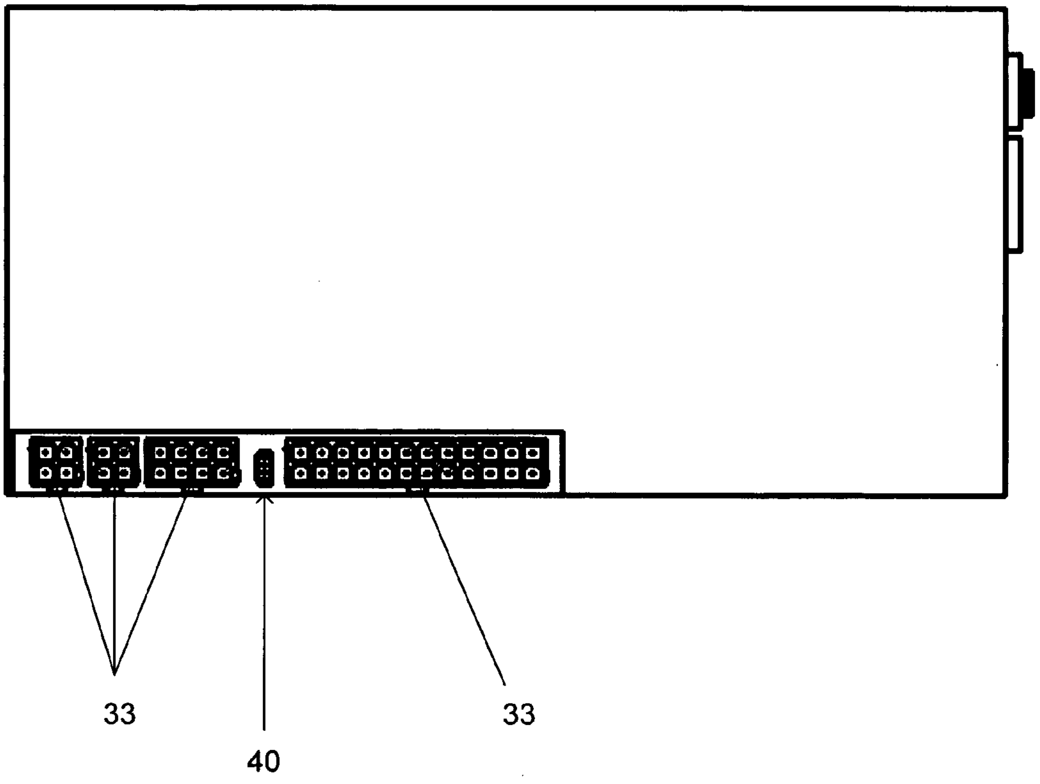
FIG. 4A-D show perspective views of power supply system in accordance with embodiments of the present invention.
Figure 4B:
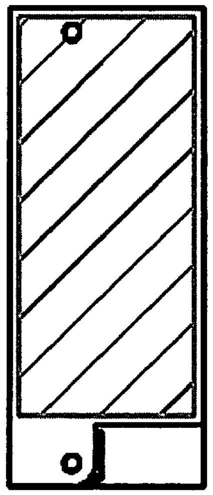
Figure 4C:
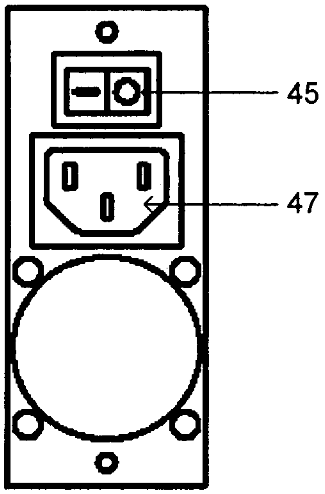
Figure 4D:
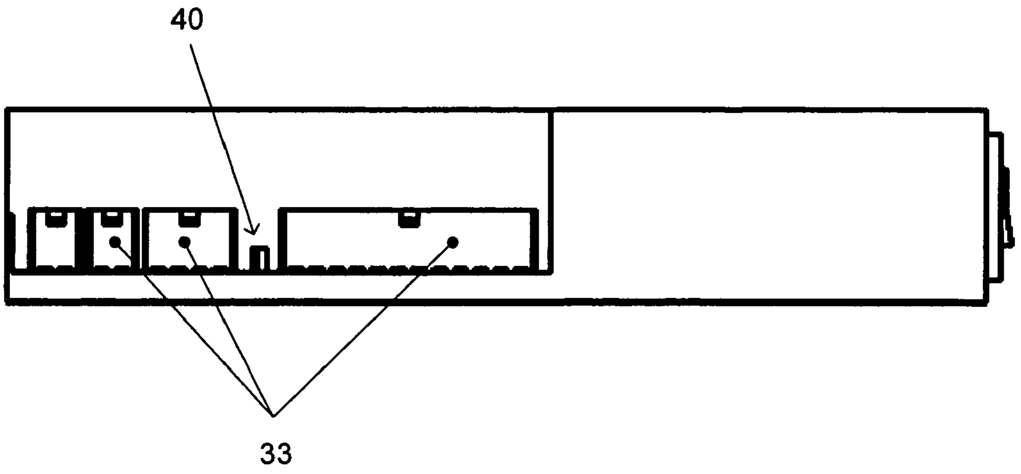

In one embodiment, the power supply has a connection for an input power cable that can connect to an external power source. For example, the power supply could be externally powered by 100-200 VAC, 50/60 Hz. An example of a connection for an input power cable 47 is shown in FIGS. 3 and 4C. This external power is converted by the power adaptor into voltages and currents which are appropriate for the many subsystems and components of a computer system.

In one embodiment, the power supply has an on/off control switch for controlling power from the power supply. FIGS. 3 and 4C show a toggle which can be used to control the on/off state of the power supply, 45.

The power supply 30 shown in FIG. 3 has output connectors 33 which can be connected to cables; each cable can connect to one or more computer subsystems or component parts. Examples of subsystems or components that could be powered by embodiments of this invention can include motherboards, disk drives, hard drives, CD-ROM, DVD, removable media drivers, modems, fans, and the like. Subsystems can include combinations of components; for example, a series of hard drives may be powered from the same cable, or a fan could be powered from the same cable as a disk drive. Each subsystem or component could be individually connected via a dedicated cable which can attach to the power supply at output connectors. Because the cables can be independently connected between the subsystem or component and the power supply, each cable can be customized for a particular component or subsystem of a computer system. The individual connections between the power supply and the subsystem or component allow the designer and builders of the computer system greater flexibility in choosing the layout of the computer system, and greater flexibility in choosing the components. In particular, the length and type of the connecting cables can be specifically chosen for each subsystem or component.

In one embodiment, the output connectors are compatible with commercially available cable connectors. In one embodiment, the output connector is a "male" connector which can mate with a "female" cable connector attached at the proximal end of connecting cable. In one embodiment, the output connector is a "female" connector which can mate with a "male" connector. In one embodiment the output connector is a ribbon-contact style connector. In one embodiment, at least one connector is an ATX-type connector (such as a 20-pin or 24-pin connector). Other connector types that could be used with embodiments of the invention include: ATX12, HDD, FDD, fan, Serial ATA (SATA), EPS, GES, and MOLEX-type connectors.

In one embodiment, the output connectors mate with any available commercial cable, including off-the-shelf extension cables. In one embodiment, cables of specific lengths can be custom made or adapted from standard types of connectors. Commercial cables can be purchased in virtually any length, and are relatively inexpensive. Cables with particular connection types compatible with the output connectors and terminals on the computer system components could also be used with embodiments of the present invention.

Connecting cables include any connectors which are compatible with the principles embodied in this invention. In one embodiment, cables are flexible, linear members constructed of an electrically conductive material which is insulated by nonconductive material. Connecting cables can include connectors at either end for establishing electrical contact between the power supply and a subsystem or component of a computer system. Connecting cables may include one or multiple conductive pathways. For example, a single cable could include two electrically conductive pathways such "ground" (0 V) and "hot" (e.g., +5 V) electrically conductive pathways. In one embodiment, output connectors of the power supply can accommodate connecting cables with multiple conductive pathways. For example, a single output connector could provide electrical connection to two electrical pathways from the power adapter (e.g. a 0 V line and a +5 V line). In one embodiment, a single connecting cable can make connections with two or more output connectors. In one embodiment, a single cable has only one electrical pathway.

In one embodiment, the power supply includes an outer case. For example, the power supply shown in FIG. 3 has an outer case 35. This outer case can provide support and protection, and can isolate the internal workings of the power supply from the computer system that it powers. The power supply can be installed into the computer system. The outer case of the power supply can also serve as a reference electrical ground.

In one embodiment, the power supply is designed to be used in computer servers of 1 U or smaller thickness (1.75 inches thick). Power supplies thicker than 1 U are also contemplated by the present invention. In one example, at least one dimension of the power supply is thinner than 1 U even after all of the connecting cables have been attached, so that the power supply can fit into the housing of a computer server of 1 U or smaller thickness.

In one embodiment, the voltages supplied to each output connector by the power adapter can be individually set to any voltage. In one embodiment, the power adapter of the power supply can provide each output connector with +5.0 V, +3.3 V, +12.0 V, −12.0V, 5 VSB or ground (0 V). The power supplied by the power adapter could also be regulated within a range. For example, the power supplied by the power adapter could be within 0.5%, 1%, 5%, 10%, or 25% of +5V, +3.3 V, +12.0 V, −12.0V, 5 VSB or ground (0 V). In one embodiment, the voltage supplied by the power adapter to the conductive pathway of an output connector can be changed.

In one embodiment the power supply includes a power adapter capable of converting input electrical power (as from a wall line) into power suitable for running all or some of the components of a computer system. In one embodiment, the power adapter of the power supply can regulate the power supplied at a given output connector to achieve a required power at the computer subsystem or component. For example, if a disk drive (e.g. a floppy drive) requires +5 W, it can be supplied by +5 V from the power supply. In one embodiment, the voltage supplied by the output connector is measured at the output connector. In one embodiment, the voltage of the output connector depends upon the voltage actually seen at the computer component. The voltage (measured at the output connector) may be adjusted by the power adapter to compensate for losses in power transmission (e.g. losses through the connecting cable), so that the power received by the component or subsystem is constant when measured at the computer component. For cables of known length and electrical properties, this difference could be calculated and compensated by adjusting the power adapter.

In one embodiment, the power supply can include at least one voltage sensing line. As used herein, unless the context indicates otherwise, a "voltage sensing line" can also be referred to as a remote sensing line. FIGS. 3 and 4 show a single voltage sensing line 40. A voltage sensing line can be used to detect the voltage actually seen by subsystem or component, for example, by sensing the voltage at the distal end of a power cable as it connects to the subsystem or component. A voltage sensing line thus allows the power supply to regulate the voltage delivered to the subsystem or component, e.g., by feedback compensation. This compensation can allow the power supply to correct for changes in the power due to, for example, the length or properties of a connection cable. Thus, the output connector supplying a disk drive requiring +5 V can be voltage regulated to power the disk drive at a constant +5 V. Feedback through a voltage sensing line is one way to achieve this contemplated by the methods of this invention.

In one embodiment, multiple voltage sensing lines can be used with the same power supply. For example, each subsystem or component could have a voltage sensing line associated with it. In other examples, only a subset of the subsystems or components has a voltage sensing line. The power supply can regulate the voltage seen by each or some of the subsystems or components using voltage sensing lines.

Electrical connection is made between the power adapter of the supply and the connecting cables and components through the output connectors 35. The output connectors mate with connectors provided at the proximal end of the connecting cables to deliver power to the subsystem or component to which the distal end of the connecting cable connects. In one embodiment, individual or sets of output connectors 35 can have different voltages and/or current requirements. In one embodiment, output connectors deliver approximately ground (0 V), +5.0 V, +3.3 V, +12.0 V, −12.0V, 5 VSB. In one embodiment, each output connector is set to a specified dedicated voltage. In one embodiment, the voltage of each connector can be set by the designer or manufacturer. In one embodiment, the voltages of the output connectors are set based upon specifications provided by the computer system manufacturer. In one embodiment, the voltages of the output connectors are determined based on power needs of the components to be powered.

In one embodiment, individual cables connect to one, two, more than two output connectors. Output connectors can be arranged near each other (e.g. adjoining) to facilitate attachment to cables when multiple output connectors will be used. In one example, each connecting cables links to a corresponding output connector. In another embodiment, output connectors could incorporate a voltage sensing line. For example, an output connector could connect also serve as a voltage sensing line.

In one embodiment, the output connectors are constructed of any combination of electrically conductive and/or insulating material so that the power supply can effectively deliver the proper power to each subsystem or component. For example, an electrically conductive portion of the output connector can be encircled by an electively insulating material. The output connectors can be electrically "matched" to the connecting cable and/or the subsystem or component.

The output connectors can be formed in any shape which allows electrical contact with a corresponding connector on a connecting cable. Either or both of the electrically conducting and insulating material can be formed in a shape to maintain electrical contact with the connecting cable. Additional structure or material can also be included to help maintain the electrical contact between a cable and one or more output connectors, such as clasps or screw mechanisms. In one embodiment, the output connectors are compatible with commercially available connector types, such as, e.g., those sold by Molex, Inc. of Lisle, Ill. In other embodiments, the output connector may be a custom configuration.

The output connectors can be located anywhere on or within the power supply that allows an electrical connection to be made with a connecting cable. In FIGS. 3 and 4 the output connectors are located on one face of the power supply, set within a recess of the power supply case. In one embodiment the output connectors are spread out around the perimeter of the power supply case. Thus, the location of the output connectors can be chosen to suit the most efficient or desirable pathway for the connection between the power supply and any particular subsystem or component. Each output connector can be independently located at different sites on the power supply case. For example, a power supply providing power to a subsystem or component (e.g. a disk drive) located distally from one side of the power supply could be connected to the power supply by output connectors which are connected on the side of the power supply closest to it. In some instances, other considerations may influence which output connectors would best provide power to a subsystem or component, such as the location of other components or subsystems, or maintaining a pathway for airflow.

The output connectors can be oriented in any direction with respect to the plane of the power supply case. FIGS. 3 and 4 show the output connectors oriented "upward," out of the plane of the power supply as shown in FIG. 4A. In one embodiment, the output connectors are oriented in the same plane as the power supply, so that they face "outward" from the power supply. Factors which can influence the orientation of the output connectors include the thickness of the power supply, the attachment to the connecting cables, the number of connecting cables, the design of the computer system, and the like. Further, the output connectors can be located or arranged independently of each other. Thus, not all of the output connectors must be oriented or located in the same fashion. Some output connectors can be oriented "upward" on one face of the power supply, and other output connectors can be oriented "outward" on another (or the same) face of the power supply.

The output connectors can also be located within "recesses" in the power supply case, as shown in FIGS. 3 and 4. Recesses allow a cleaner profile, and could also be used to help anchor the connecting cables to the output connectors. In some embodiments, the shape of the power supply case is largely rectangular, as shown in FIGS. 3 and 4. It should be noted, however, that the power supply and power supply case can be any shape which allows the power supply to provide power to the subsystems and components by connecting to output connectors. In one embodiment, the power supply is approximately rectangular in shape.

In one embodiment, the output connectors are located within the power supply based on the location of the subsystems or components for which they provide power. In one embodiment, output connectors are located on the power supply also based on the output power that they provide. In one embodiment, some output connectors are "clustered" near other output connectors. For example, pairs of output connectors can be grouped based on providing ground and +5 V, +3.3 V, +12 V, 5 VSB, or −12 V.

Output connectors can also be clustered to connect to a single cable where a computer system component or subsystem uses multiple power levels. One member of this "cluster" could also be a voltage sensing line. In one embodiment, clusters of output connectors correspond to the number of "pins" which drive a subsystem or component. For example, clusters of 80 "pins", 68 "pins", 50 "pins", 24 "pins", 8 "pins", and/or 4 "pins" can be used, as well as other size clusters.

In one embodiment, the output connectors can be of different types. For example, some output connectors can be adapted to accommodate 24-pin connectors, 8-pin connectors, 4-pin connectors, and the like. In one embodiment, different output connectors on the power supply are specifically adapted to mate with different connection cables. In one embodiment, the output connectors are arranged in different configurations.

In one embodiment, the power supply has at least two clusters of output connectors. Each cluster of output connectors can be made of one or more individual output connectors, and the different clusters of connectors can be separated from the other cluster or clusters. At least one separate connecting cable attaches to each cluster of output connectors. In one embodiment, each cluster of output connectors can include a voltage sensing line. In one embodiment, each cluster of output connectors connects to an individual computer system component.

Power supplies in accordance with embodiments of the present invention may achieve numerous advantages. For example, the use of two or more clusters of output connectors for attachment to individual computer components via two or more connection cables as described above can provide a flexible and inexpensive method of connecting computer components in computer systems with different designs, for example, computer systems with different motherboards. In addition, having multiple clusters of output connectors allows individual connecting cables to be chosen based on the length required to connect each component, thereby eliminating excess cable length and additional connectors. This is in contrast with power supplies that utilize a monolithic or integrated output connector which connects to the power supply and then splits into multiple connections for individual computer components or subsystems. Such monolithic output connectors can increase manufacturing costs, and can consume larger portions of the total volume of the computer system housing than the above-described power supply with multiple clusters of output connectors. For example, a manufacturer may need to stock different integrated cable interfaces in order to produce computer systems in which the components were arranged differently (e.g. different motherboards) or had different power needs.

The foregoing description of the preferred embodiments of the invention has been presented for the purposes of illustration and description. It is not intended to be exhaustive or to limit the invention to the precise form disclosed. Many modifications and variations are possible in light of the above teaching. For example, although the embodiments described above refer to power supplies for computer systems, in other embodiments the power supplies may be used for other electronic or electrical systems, such as audio systems.

The figures provided are merely representational and may not be drawn to scale. Certain proportions thereof may be exaggerated, while others may be minimized. The figures are intended to illustrate various implementations of the invention that can be understood and appropriately carried out by those of ordinary skill in the art.

Therefore, it should be understood that the invention can be practiced with modification and alteration within the spirit and scope of the appended claims. The description is not intended to be exhaustive or to limit the invention to the precise form disclosed. It should be understood that the invention can be practiced with modification and alteration and that the invention be limited only by the claims and the equivalents thereof.

What is claimed is:

1. A power supply apparatus for powering a computer system comprising:

a power supply case having a plurality of faces including a first face and a second face substantially perpendicular to said first face;

a power adapter contained in the power supply case for providing electrical power;

an input power connector for receiving input power, wherein said input power connector is in electrical connection with said power adapter; and a plurality of output connectors in electrical connection with said power adapter, each of the output connectors being fixedly mounted to the power supply case;

wherein said power adapter is further configured to provide each of said plurality of output connectors an output power;

wherein said plurality of output connectors are located on at least two of the plurality of faces of said power supply case;

wherein at least one of said plurality of output connectors is located within a recess formed in at least said first face and said second face of said power supply case; and wherein said power supply apparatus has at least two clusters of said output connectors, each of the clusters configured to attach to at least one connecting cable.

2. The power supply apparatus of claim 1 wherein each component of a computer system powered by said power supply is connected by at least one cable connected to at least one of said output connectors.

3. The power supply apparatus of claim 1 wherein each subsystem of a computer system powered by said power supply is connected by at least one cable connected to at least one of said output connectors.

4. The power supply apparatus of claim 1 wherein said output power of each of said output connectors is substantially +5.0 V, +3.3 V, +12.0 V, −12.0V, 5 VSB, or ground (0 V).

5. The power supply apparatus of claim 1 further comprising an on/off switch.

6. The power supply apparatus of claim 1 wherein said power supply is thinner than 1 U in at least one dimension.

7. The power supply apparatus of claim 1 wherein at least some of said plurality of output connectors are oriented away from the center of the power supply.

8. The power supply apparatus of claim 1 further comprising at least one voltage sensor connector.

9. The power supply apparatus of claim 1 further comprising a plurality of connecting cables, each connecting cable having a first connector for coupling with one of the plurality of output connectors at a proximal end of the connecting cable, and having a second connector for coupling with a computer system component at a distal end of the connecting cable.

10. The power supply apparatus of claim 1 wherein at least one of the plurality of output connectors comprises an ATX-style connector.

11. A computer system, comprising:

a computer chassis;

one or more computer components contained in the computer chassis;

a power supply having a plurality of output connectors and a power supply case having a plurality of faces including a first face and a second face substantially pemendicuiar to said first face, wherein said plurality of output connectors are located on at least two of the plurality of faces of said power supply case, and are each fixedly mounted to the power supply case; and a plurality of power cables, each power cable having a first cable connector provided at a proximal end and a second cable connector provided at a distal end;

wherein for each power cable, the first cable connector is mated with one of the plurality of output connectors on the power supply, and the second cable connector is mated with one of the computer components; and wherein at least one of said plurality of output connectors is located within a recess formed in at least said first face and said second face of said power supply case.

12. The computer system of 11, wherein one of the computer components comprises a motherboard.

13. The computer system of 11, wherein one of the computer components comprises a hard drive.

* * * * *